United States Patent
Hess et al.

(10) Patent No.: US 10,341,125 B2
(45) Date of Patent: Jul. 2, 2019

(54) ACTIVE COOLING ARRANGEMENT FOR POWER OVER ETHERNET ARRANGEMENTS

(71) Applicant: Nexans, Paris (FR)

(72) Inventors: Bradley Hess, Sinking Spring, PA (US); Thomas Aberasturi, Chicago, IL (US)

(73) Assignee: NEXANS, Courbevoie (FR)

( * ) Notice: Subject to any disclaimer, the term of this patent is extended or adjusted under 35 U.S.C. 154(b) by 181 days.

(21) Appl. No.: 15/394,130

(22) Filed: Dec. 29, 2016

(65) Prior Publication Data

US 2018/0191513 A1 Jul. 5, 2018

(51) Int. Cl.
| | |
|---|---|
| H01B 7/42 | (2006.01) |
| H05K 7/20 | (2006.01) |
| H01B 11/02 | (2006.01) |
| H04L 12/10 | (2006.01) |
| H04L 12/403 | (2006.01) |

(52) U.S. Cl.
CPC ............ *H04L 12/10* (2013.01); *H01B 7/421* (2013.01); *H01B 11/02* (2013.01); *H04L 12/403* (2013.01); *H05K 7/20* (2013.01)

(58) Field of Classification Search
CPC ......... H01B 7/421; H01B 11/02; H04L 12/10; H05K 7/20
See application file for complete search history.

(56) References Cited

U.S. PATENT DOCUMENTS

| | | | |
|---|---|---|---|
| 7,593,747 B1 | 9/2009 | Karam et al. | |
| 9,734,940 B1 * | 8/2017 | McNutt | H01B 11/1033 |
| 2009/0027033 A1 | 1/2009 | Diab | |
| 2010/0211806 A1 | 4/2010 | Diab et al. | |
| 2011/0258465 A1 | 10/2011 | Diab et al. | |
| 2014/0102755 A1 | 4/2014 | Adriaenssens | |

FOREIGN PATENT DOCUMENTS

| | | | |
|---|---|---|---|
| JP | 55-68006 A | * | 5/1980 |
| JP | 2000091778 A | * | 3/2000 |
| JP | 2003032865 A | * | 1/2003 |

OTHER PUBLICATIONS

International Search Report dated May 31, 2018.

* cited by examiner

*Primary Examiner* — Ryan Johnson
(74) *Attorney, Agent, or Firm* — Sofer & Haroun, LLP

(57) ABSTRACT

To this end a cable is provided for tandem communication and power transmission. The cable has a plurality of twisted pair conductors, a jacket surrounding said twisted pair conductors, and at least one active cooling element. The at least one active cooling element is configured to provide a thermoelectric cooling effect to the cable when one or more of said plurality of twisted pairs are employed to transfer electrical power in a power over Ethernet application.

5 Claims, 11 Drawing Sheets

ACTIVE COOLING ARRANGEMENT FOR POWER OVER ETHERNET ARRANGEMENTS

RELATED APPLICATIONS

This application is related to co-pending U.S. patent application Ser. No. 15/204,583, filed on Jul. 7, 2016, the entirety of which is incorporated by reference.

BACKGROUND

Field of the Invention

This invention relates to power over Ethernet cable arrangements. More particularly, this invention relates to active cooling arrangements for power over Ethernet arrangements.

Description of Related Art

A recent development in communications cabling is the tandem delivery of power and data signals through a single cable. Although not always the case, a typical arrangement would utilize a normal LAN (Local Area Network) twisted pair cable, usually having four twisted pairs of insulated copper conductors therein. In normal LAN operations all four pairs are for data communication. However, in tandem power/data applications some of the pairs are dedicated to data communications but one or more of the pairs can be used to deliver power though the same cable. In some cases, a twisted pair carrying data can also carry power at the same time as the data transmits via AC (alternating current) and the power transmits via DC (direct current) so it is possible to split the power and data signals from one another as needed. Such data/power tandem arrangements can be used for example with security cameras or VoIP phones which require a small amount of power as well as data communication.

Initially, IEEE (Institute for Electrical and Electronics Engineers) adopted the 802.3af standard for Power over Ethernet (Or PoE) which has been widely accepted in the industry setting the relevant parameters, such as wattage, negotiation parameters/routines, DC loop resistance etc. . . . , for delivering power in tandem with data. The total amount of power that can be delivered under this standard is 12.95 W which is adequate for such basic applications such as the standard VoIP phones and security cameras noted above.

However, growing lists of features on devices that are connected and powered with tandem power/data cables as well as new communication equipment that likewise can make use of the tandem power/data through LAN cables, has necessitated even more power throughput allowance. IEEE 802.8at is an updated standard that allows for an increase to 25.5 W power (PoE+) to be delivered through such tandem cables. Another even newer standard is IEEE 802.3bt that sets the parameters for using all four twisted pairs to simultaneously send data and power. In the conditions according to this newer standard, cables sending both data and power in some cases will be delivering as much as 100 Watts. These high rates of power transmission can lead to the operating temperatures of the cable exceeding its maximum allowable operating temperature according to the cables own heat tolerance thresholds. This is especially true when large numbers of cables are installed together or bundled adjacent to and abutting one another. Such excessive heat generation is not only a fire hazard, but also the prolonged heating causes a degradation of the cable materials (e.g. jackets, pair insulation etc. . . . ) faster than under normal signal transmission only conditions.

With this increase in power throughput through one or more of the twisted pairs of a LAN cable, there is a corresponding increase in heat that needs to be dissipated from the cables to the environment. This leads to concerns about fire safety and data transmission performance and ultimately limits the number of such tandem operation cables that can occupy a single pathway or be arranged next to one another in order to stay within the range of safe operating temperatures. For example the NFPA (National Fire Protection Association) 70 standard, setting the National Electrical Code covering these cables, requires that the cables do not exceed their listed maximum operating temperature which is typically 60 C.

As shown in prior art FIGS. 1 and 2, typical LAN cables are constructed having four insulated twisted pairs, an optional cross filler (depending on the data signal requirements), and an outer jacket enclosing the cable. The prior jackets for twisted-pair cables do not take heat dissipation into consideration, and therefore, are not optimized for supporting power provided through one or more of its twisted pairs. Standard cable jackets such as those shown in FIGS. 1 and 2 possess an outer surface that generally maintains an equal distance from the center of the cable for the entire length of the cable. When multiple LAN cables are placed together they touch along their entire longitudinal axis (longest axis) and entrap the heat generated by the power conductors as conductive heat transfer is less efficient than convective heat transfer.

In the related U.S. patent application Ser. No. 15/204,583, and as shown in FIGS. 3 and 4, one arrangement is provided where the jackets of the cables, used in power over Ethernet applications have a series of ridges or valleys disposed, circumferentially or helically around the outer surface of the cable jacket. Such ridges or valleys are spaced apart from one another over the length of the cable. These structures, either ridges or valleys generate an air gap between adjacent cables allowing air to flow between, allowing the heat released from the one or more powered twisted pairs to escape more easily through the outer surface of the jacket and to generate a convection air flow upward around and in between the cables.

OBJECTS AND SUMMARY

The present arrangement overcomes the drawbacks associated with the prior art and provides a manner for implementing active cooling into cable arrangements that implement power over Ethernet. In one arrangement, elements of the cable structure are fitted with active cooling arrangements, in the place of, or as part of normal twisted pair cable structures. In another arrangement, cables and/or cable bundles are provided with, or are arranged within, archiving cooling components. Such active cooling arrangements may be a thermoelectric or similar device/structure that employs any one of the Seebeck effect, the Peltier effect, and/or Thomson effect, generally referred to as thermoelectric effects.

In another arrangement, the supplied power signals are regulated or staggered through said PoE cable arrangements to one or more powered items to limit power throughput and consequentially limit heating of the cable arrangements.

To this end a cable is provided for tandem communication and power transmission. The cable has a plurality of twisted pair conductors, a jacket surrounding said twisted pair conductors, and at least one active cooling element. The at least one active cooling element is configured to provide a thermoelectric cooling effect to the cable when one or more of said plurality of twisted pairs are employed to transfer electrical power in a power over Ethernet application.

In another embodiment, the present arrangement provides for a cable bundle containing at least one cable configured for tandem communication and power transmission. The bundle includes a plurality of twisted pair cables each having a plurality of twisted pair conductors and a jacket surrounding the twisted pair conductors. The bundle has at least one active cooling element. The at least one active cooling element is positioned among the twisted pair cables and is configured to provide a thermoelectric cooling effect to the bundle when one or more of the cables has twisted pairs that are employed to transfer electrical power in a power over Ethernet application.

In another embodiment, the present arrangement is directed to a power over Ethernet arrangement employing a cable bundle containing at least one cable configured for tandem communication and power transmission. The arrangement has a power/signal transmission unit, at least one device requiring signal and power, and a cable bundle, the bundle having, a plurality of twisted pair cables. Each twisted pair cable has a plurality of twisted pair conductors and a jacket surrounding said twisted pair conductors. The power/signal transmission unit provides power to the at least one device in an intermittent cycle to reduce the heat generated in the cable bundle.

BRIEF DESCRIPTION OF THE DRAWINGS

The present invention can be best understood through the following description and accompanying drawings, wherein.

DETAILED DESCRIPTION

Figure 1:
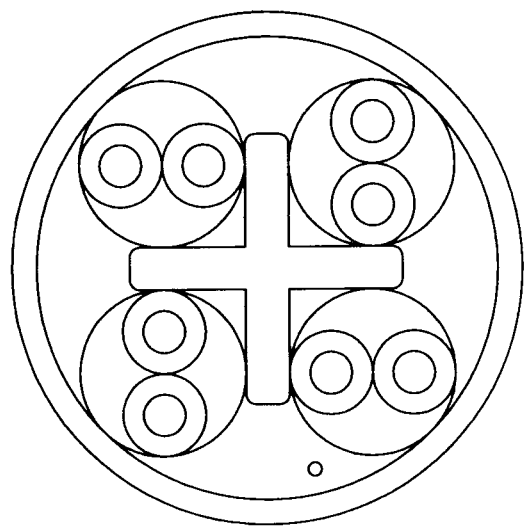
FIGS. 1 and 2 illustrate prior art LAN cables, capable of supporting tandem power and data communications in the same cable.
Figure 2:
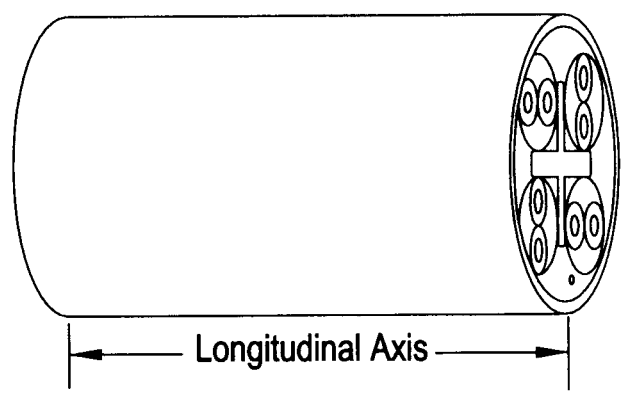
Figure 3:
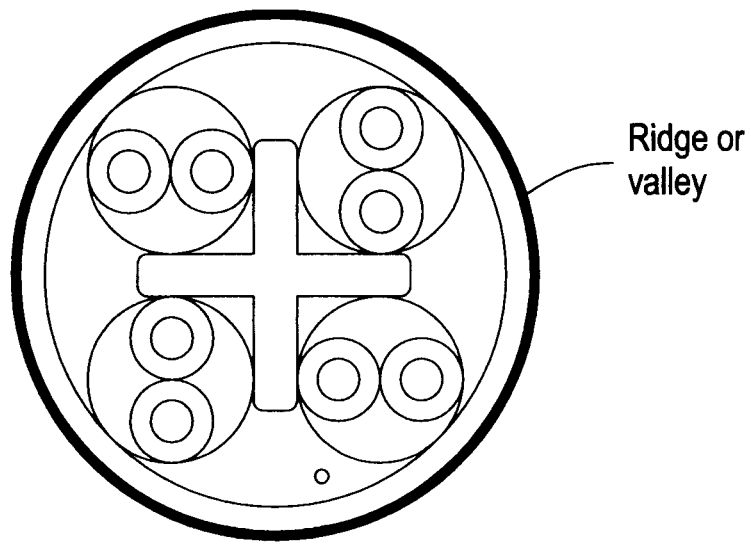
FIGS. 3 and 4 illustrate a LAN cable, capable of supporting tandem power and data communications in the same cable with a jacket having ridges and valleys for heat dissipation.
Figure 4:
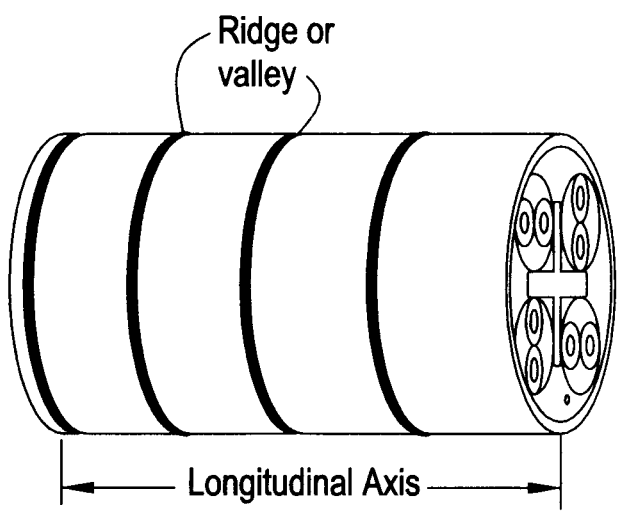

In one embodiment of the present arrangement a LAN cable is provided having a cable 10, four twisted pairs 12, each made from two twisted insulated copper conductors, a cross filler 14, a drain wire 16 and a jacket 18. Jacket 18 may be constructed from any suitable polymer such as PVC (PolyVinylChloride) or PE (PolyEthylene). It is understood that that this form of tandem power/data communications cable is being shown for illustration purposes only, but is not intended to limit the scope of the application. The applicable heat dissipating features as described below can be applied to any tandem power/data communication cable arrangement. As indicated in the background, one or more of the twisted pairs 12 may be used to transmit power. The basic cable elements of cable 10 are the same as shown in prior art FIGS. 1 and 2. However, beginning with FIG. 5A, such cable 10 is shown with active cooling arrangements according to the present embodiments, described in more detail below.

In some embodiments described herein active cooling arrangements may be added to cable 10. In other embodiments, active cooling arrangements may be added or applied over bundles over ordinary twisted pair cables. In other embodiments such active cooling arrangements may be combined with active cooling arrangements applied over cables 10 themselves that have active cooling arrangements. It is to be understood that the below described structures and embodiments are combinable as desired by a cable structure engineer.

In a first embodiment an active cooling element is incorporated into the structure of cable itself. The active cooling structure may be a thermoelectric or similar device employing one of the Seebeck effect, the Peltier effect, and/or Thomson effect, generally referred to as thermoelectric effects.

Generally speaking the thermoelectric effect is the direct conversion of temperature differences to electric voltage and vice versa. A thermoelectric device creates voltage when there is a different temperature on each side, and conversely, when a voltage is applied to it, it creates a temperature difference.

There are three main types/varients of the thermoelectric effect, namely the Seebeck effect, Peltier effect, and Thomson effect. The Seebeck effect is the conversion of heat/electricity directly into electricity/heat at the junction of different types of wire. The Peltier effect is the presence of heating or cooling at an electrified junction of two different conductors. When a current is made to flow through a junction between two conductors, heat may be generated or removed at the junction. In different materials, the Seebeck coefficient is not constant in temperature, and so a spatial gradient in temperature can result in a gradient in the Seebeck coefficient. If a current is driven through this gradient then a continuous version of the Peltier effect will occur, referred to as the Thomson effect.

In the present arrangement, it is contemplated that a "thermoelectric component" as described hereinafter refers to either an independent structure or a modified cable structure that has the requisite structure for exhibiting a thermoelectric effect, in the present case for the purposes of cooling, when a voltage is applied thereto, either from an externally connected thermoelectric controller or possibly from voltages present directly in the powered pair of cable 10.

Figure 5A:
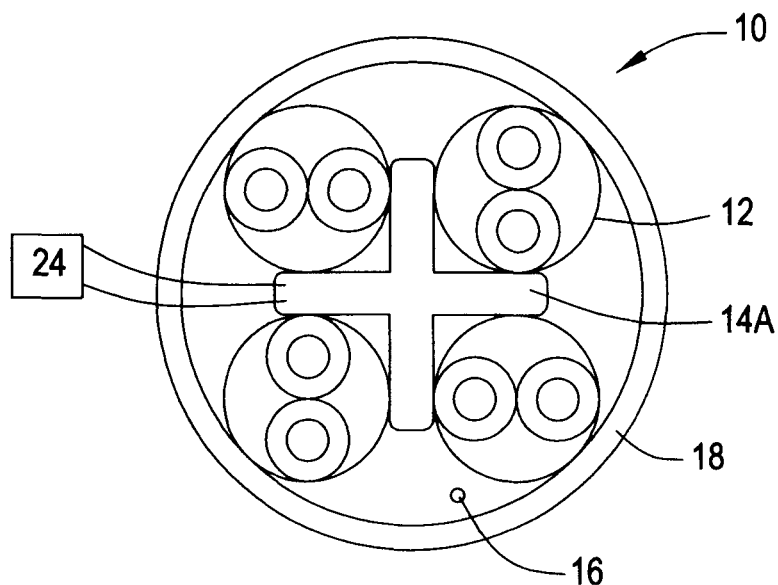
FIGS. 5A-5D each illustrates a LAN cable having an active cooling element, in accordance with one embodiment.
Figure 5B:
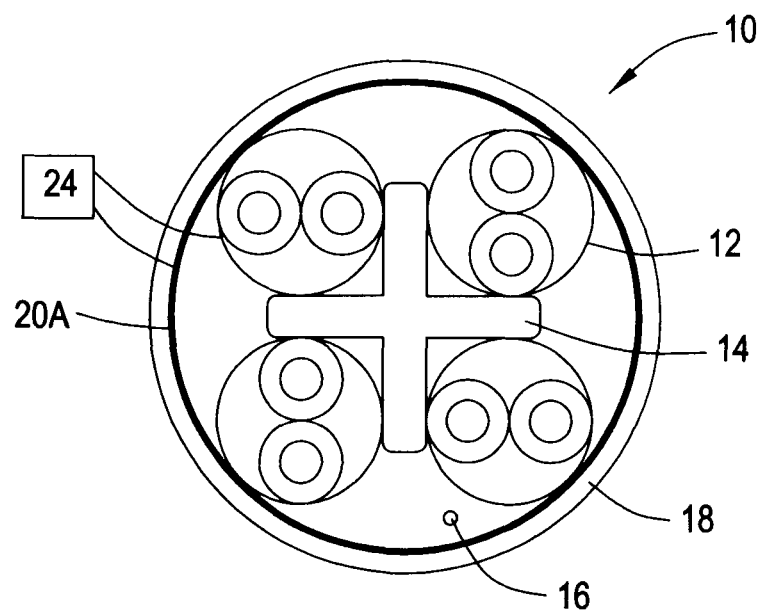
Figure 5C:
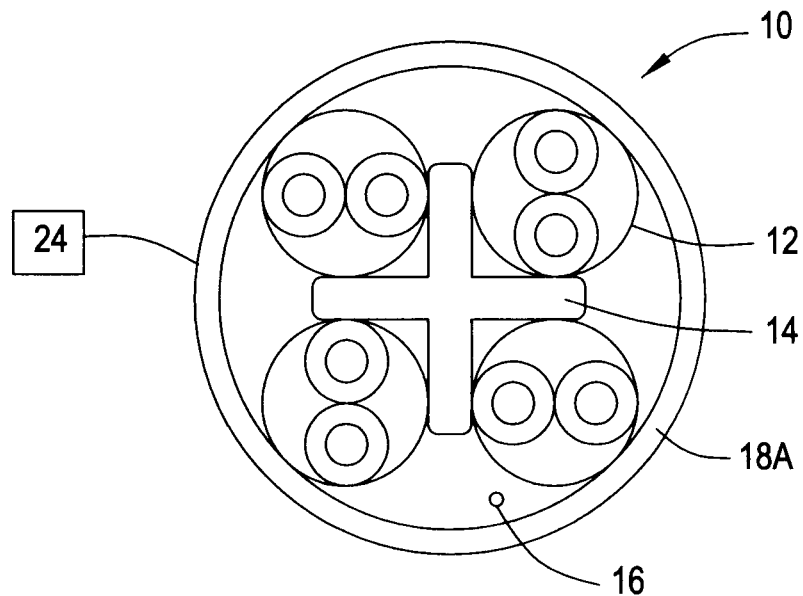
Figure 5D:
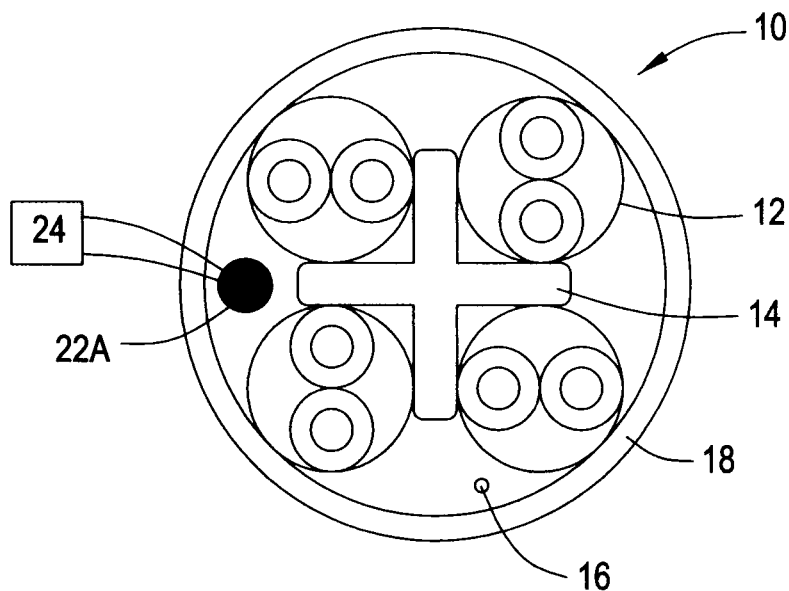

In one embodiment of the present arrangement, as shown in FIG. 5A, such a thermoelectric component can be integrated in the cable as central filler 14a (here shown as a cross filler, but can be any shape). In FIG. 5B, the thermoelectric component can be in the form of a shield or wrap 20a. In FIG. 5C the thermoelectric component can be in the form of a portion 18a of the jacket 18. In FIG. 5D, the thermoelectric component can be in the form of a physical longitudinal structure 22a (e.g. cylindrical insert), preferably located in proximity with the power conducting pair 12.

In each case, such thermoelectric components are coupled to a thermoelectric controller 24 located on or near cable 10 so as to provide the required voltages to generate the desired thermoelectric cooling to offset the heat generated by the power conducting pair(s) 12.

Figure 6:
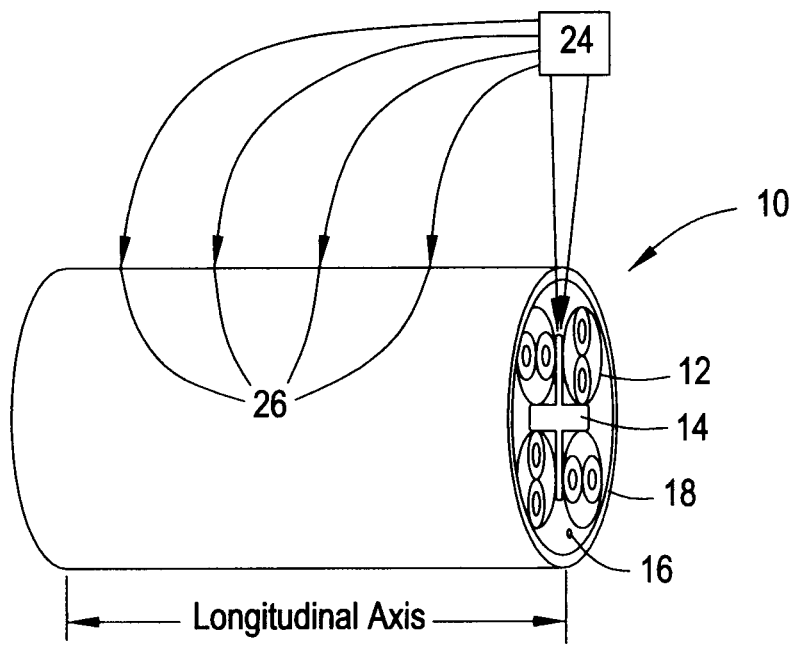
FIG. 6 illustrates a LAN cable having an active cooling element and thermometer(s), in accordance with one embodiment.

In one embodiment in addition to the active cooling elements (14a, 20a, 18a and/or 22a), as shown in FIG. 6, cable 10 may also have one or more thermometer/thermocouples 26 located along the length of cable 10. Such thermostats 26 are coupled with thermoelectric controller 24 in order to monitor the temperature of either cable 10, the powered pair(s) 12 or both, so that controller 24 can, as needed, apply voltage to the active cooling elements (14a, 20a, 18a and/or 22a).

Figure 7:
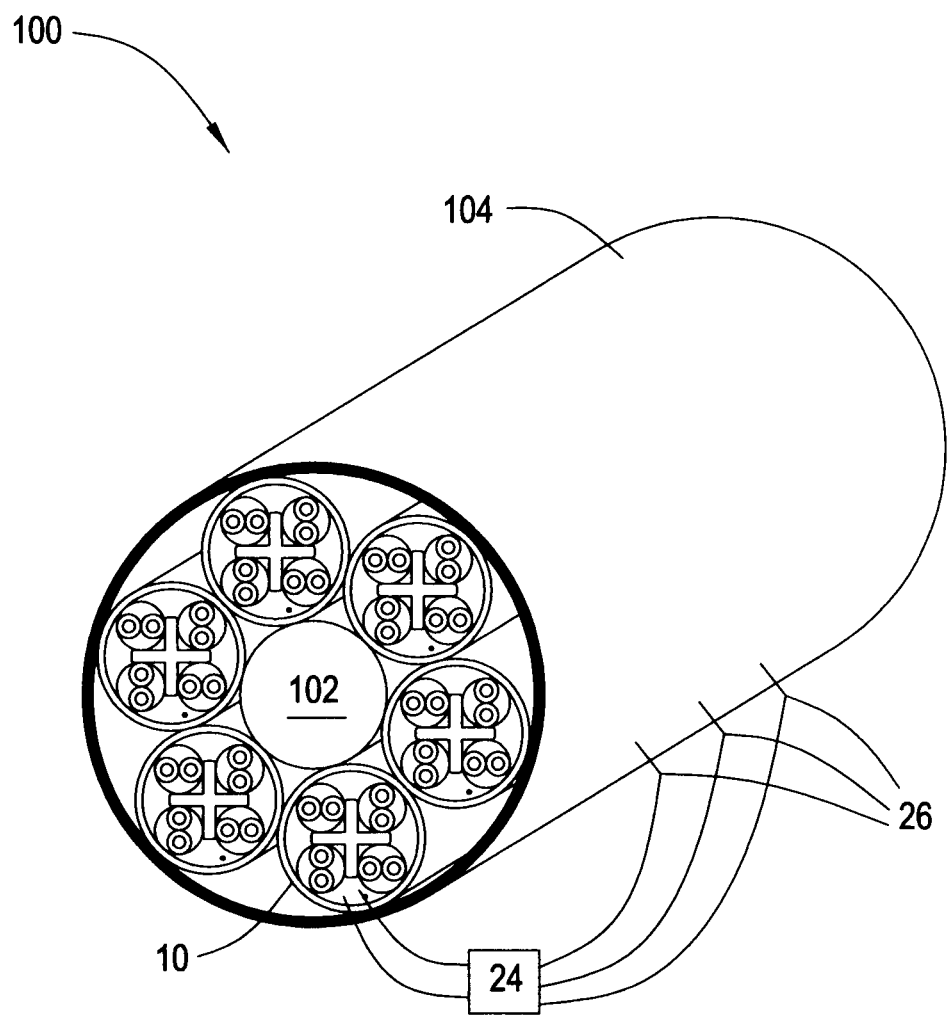
FIG. 7 illustrates a LAN cable bundle with a cable having an active cooling element, in accordance with one embodiment.

In another embodiment, FIG. 7 shows a bundle 100 of cables 10. In this arrangement six (6) cables are arranged around a hollow tube 102. It is noted that, in this and the following embodiments related to bundles 100 of cables 10, one or more of the cables 10 may be tandem power/communication cables, bundle 100 may have any number of cables 10 therein depending on the desired application, an optional binder 104 may be applied as required, and cables 10 may be helically or S-Z stranded. Within bundle 100, a hollow tube 102 may be optionally added for conveying heat from bundle 100, either by convection or possibly with a fan/compressor (not pictured) to increase airflow. In each case, such typical LAN cable bundling arrangements are applicable to the present arrangement. However, for simplifying the explanation of the following active cooling arrangements for cable bundles, bundle 100 of FIG. 7 is used as an exemplary cable bundle model.

Figure 8:
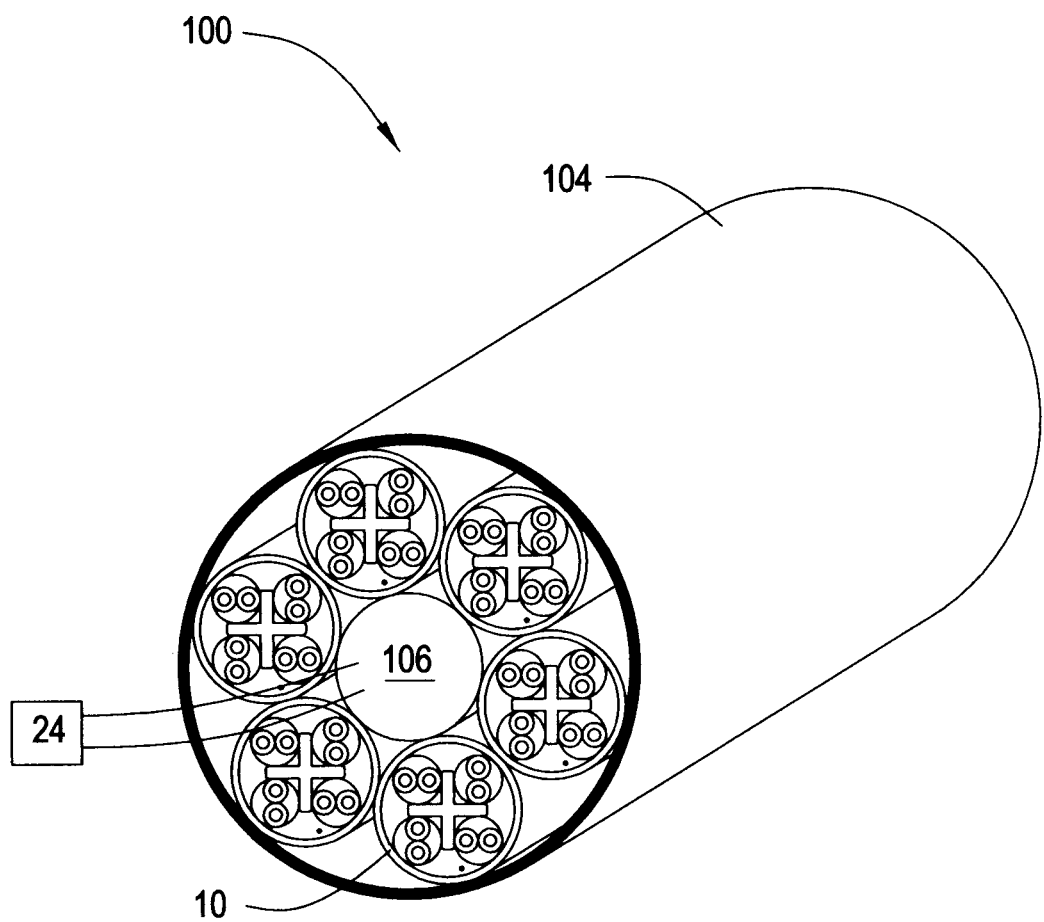
FIG. 8 illustrates a LAN cable bundle with an active cooling element, in accordance with one embodiment.

In one embodiment, as shown in FIG. 8, instead of hollow tube 102, the central position of bundle 100 is filled with a "dummy" active cooling structure 106 that works similar to the active cooling arrangements that are applied within cable 10 as discussed above. Here, the cables of bundle 100 may be either cables 10 as discussed above or otherwise regular prior art Power over Ethernet cables that do not have their own active cooling elements (as pictured in FIG. 8). The term "dummy" is used to mean that the active cooling structure 106 is not a twisted pair cable but is only similarly dimensioned and is thus named a "dummy" cable. Nevertheless in this context, it is still an active thermoelectric cooling structure.

Figure 9:
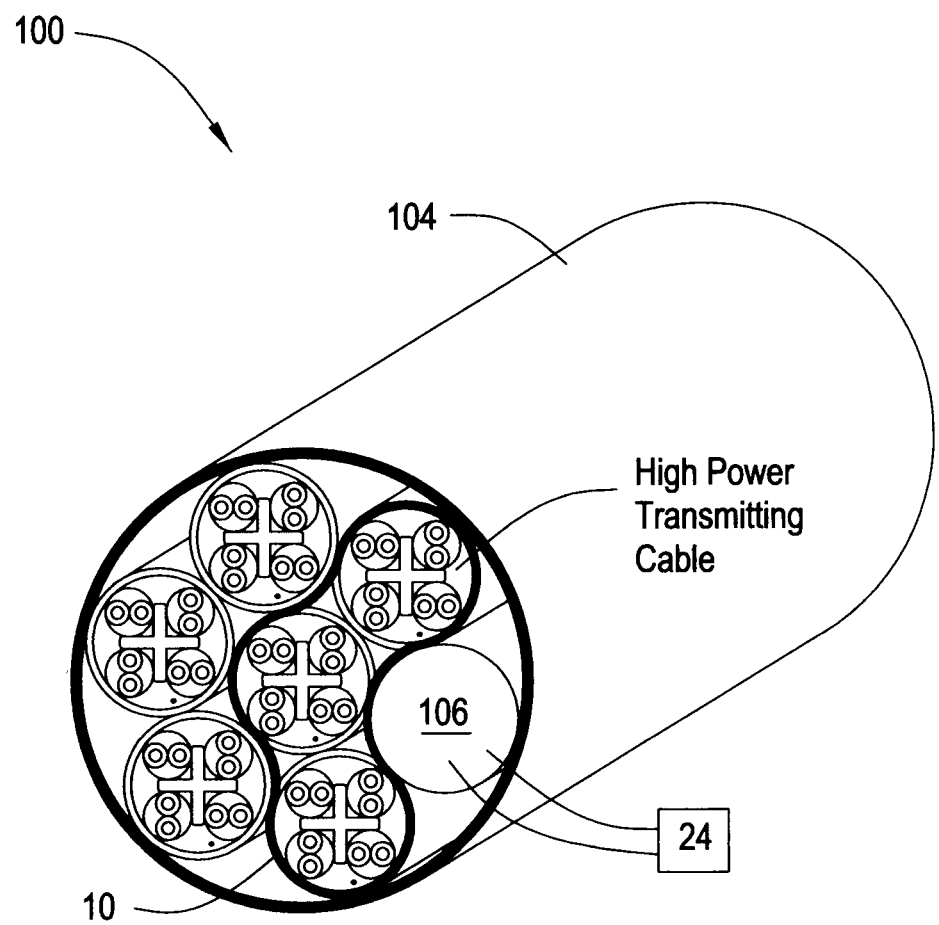
FIG. 9 illustrates a LAN cable bundle with an active cooling element, in accordance with one embodiment.
Figure 10:
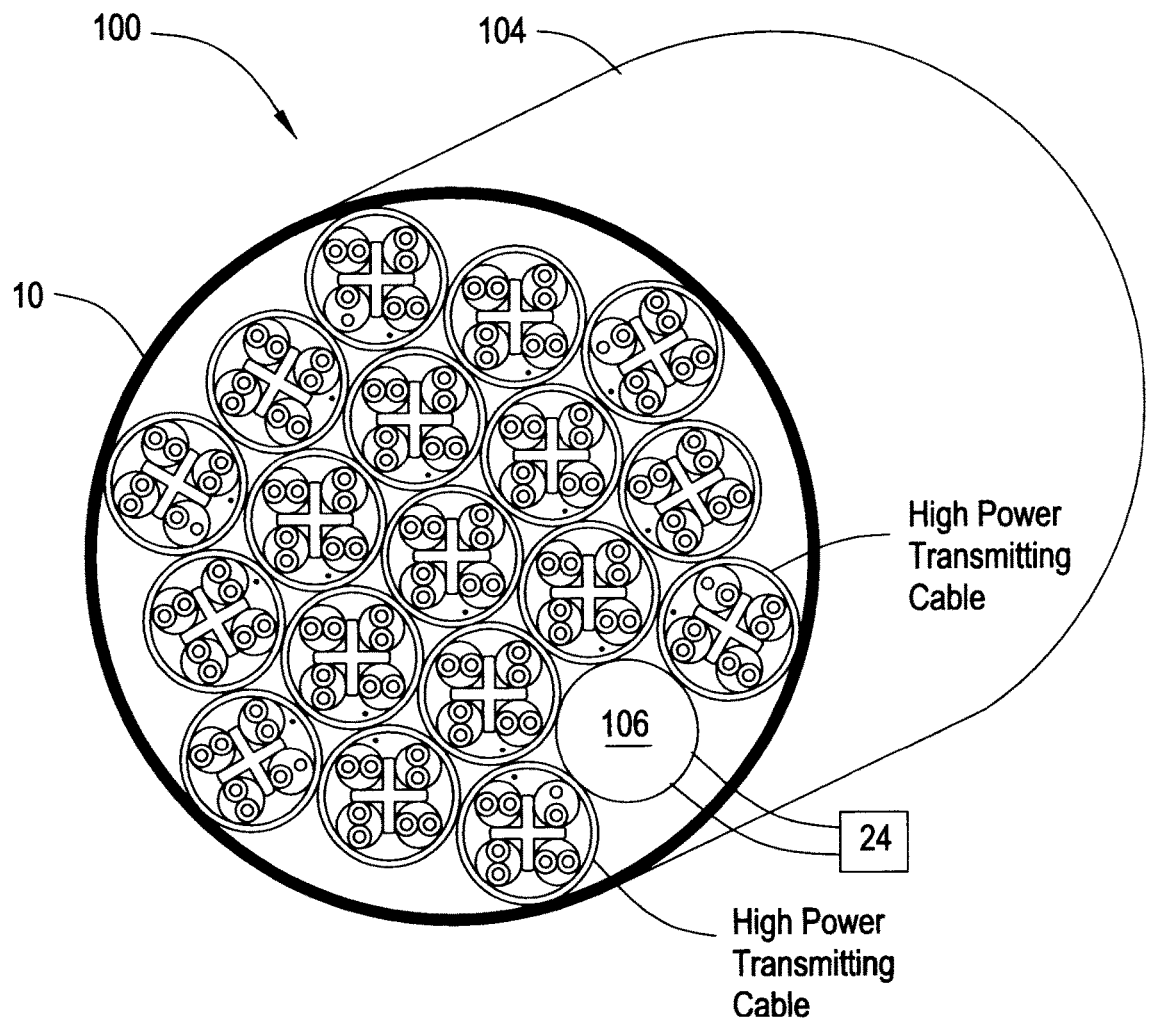
FIG. 10 illustrates a LAN cable bundle with an active cooling element, in accordance with one embodiment.

In another embodiment as shown in FIG. 9, the "dummy" active structure 106 may be located outside of the center location, possibly near cables (or cables 10) that are conducting the most power and have the most significant heat issues. In FIG. 10, a larger bundle 100 is shown having two layers of LAN cables 10. In this arrangement the higher power transmitting cables 10 (or cables 10 if they are actively cooled) are located in the outer layer, possibly, as shown, with a "dummy" active cooling arrangement as pictured.

Figure 11:
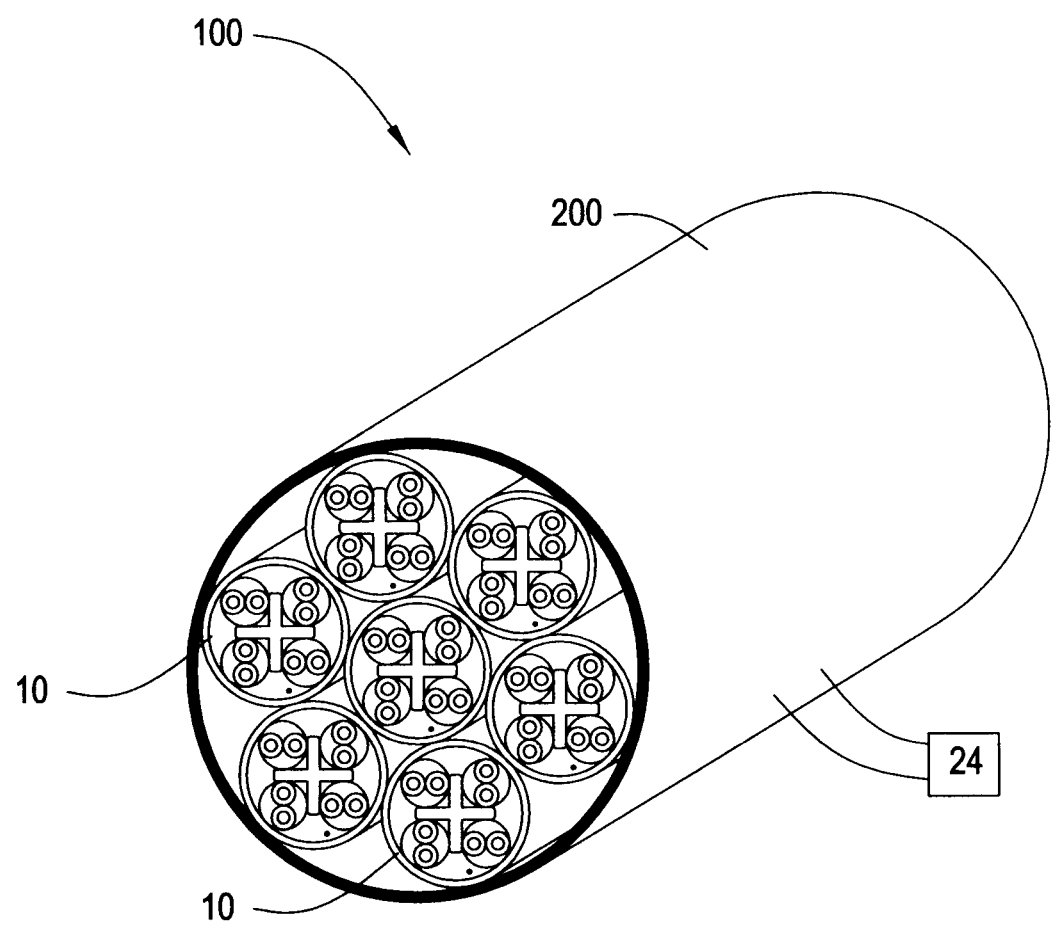
FIG. 11 illustrates a LAN cable bundle with an added active cooling element, in accordance with one embodiment.

In another embodiment as shown in FIG. 11, a bundle 100 may have an active cooling arrangement in the form of a conduit or sleeve 200 that is placed over bundle 100. Again, the elements within bundle 100 may be either typical PoE cables or cables 10 that are themselves actively cooled. In any case, in this embodiment, conduit or sleeve 200 may be a flexible or braided sleeve, or a rigid conduit as needed for the desired application.

In another embodiment, each of the above cables 10 and/or bundles 100 may, in addition to having active cooling thermoelectric elements, also be employed with a power controller that can manage the power being transmitted through the power conductor pairs 12 of cables 10 in a staggered or intermittent manner to further reduce the generated heat in such cables 10/bundles 100.

Such a method may be applied to a single cable (or cable 10) to manage the power being sent through a single PoE cable. Alternatively the method may include time multiplexing the power cycling or power levels throughout the bundle to limit the temperature of a bundle below a set threshold. This can be implemented in the form of a software or a hardware arrangement.

Figure 12:
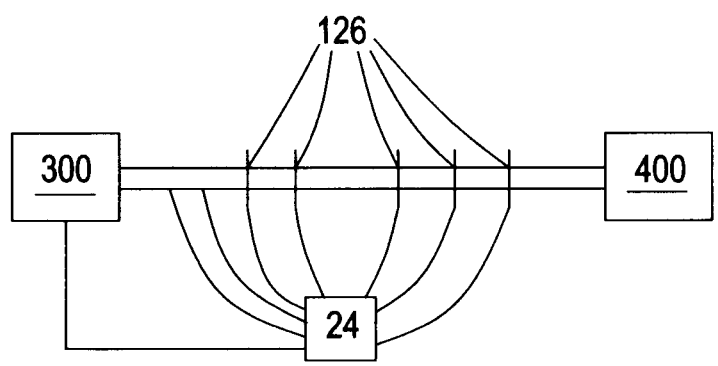
FIG. 12 illustrates a power over Ethernet arrangement between a power/signal supplier to devices, via a LAN cable bundle, in accordance with one embodiment.

As shown in FIG. 12, a cable bundle is positioned between a signal source/power source 300 and an array of devices requiring signals and power 400. The cable bundle in this case is a cable bundle 100 that includes an active cooling element therein, and may optionally include at least one cable 10 that itself includes an active cooling element. However, it is understood that the present embodiment may be used in connection with an ordinary PoE bundle/cable that does not have any active cooling element. In this exemplary arrangement, bundle 100 has a series of thermometers 126, similar to that shown above in FIG. 6, along the length of bundle 100. In this case, the active cooling element of bundle 100 (here in FIG. 12 a dummy element 106 in the bundle as in FIG. 8) as well as the thermometers 126 are attached to the temperature voltage controller 24. The voltage temperature controller is also coupled with the source/power source 300.

In operation, normal PoE operations are conducted between power/signal source 300 and devices 400 via bundle 100. However, instead of performing constant power transmission, as noted above, power is intermittently transmitted through the different cables 10 of bundle 100 in some form of a staggered manner, including time multiplexing the power cycling throughout bundle 100. This limits the overall power throughput through cables 10 of bundle 100 in a manner to limit heat generation. This can be done automatically, or it can be done in response to certain triggering thresholds detected by thermometers 126. Moreover, the power cycling can be done independently from or in conjunction with cycling or powering of the various active cooling elements of bundles 100/cables 10 as controlled by controller 24 to selectively power cycle and actively cool during periods of higher power consumption.

While only certain features of the invention have been illustrated and described herein, many modifications, substitutions, changes or equivalents will now occur to those skilled in the art. It is therefore, to be understood that this application is intended to cover all such modifications and changes that fall within the true spirit of the invention.

The invention claimed is:

1. A cable, configured for tandem communication and power transmission, said cable comprising:
   a plurality of twisted pair conductors for transmitting communication signals;
   at least one conductor for conducting electricity with said cable;
   a jacket surrounding said twisted pair conductors; and
   at least one active cooling element,
   wherein said at least one active cooling element is a replacement element in the form of a cable filler, an internal cable component, and a foil/wrapper, that would otherwise in a non-cooling fashion be present in said cable, and is configured to provide a thermoelectric cooling effect to said cable when one or more of said plurality of twisted pairs are employed to transfer electrical power in a power over Ethernet application.

2. The cable as claimed in claim 1, wherein said active cooling element is any one of a Seebeck element, a Peltier element and a Thomson element.

3. The cable as claimed in claim 1, further comprising a controller, coupled to said active cooling element to provide voltage thereto to generate the desired cooling effect.

4. The cable as claimed in claim 3, wherein said cable further comprises at least one thermometer/thermocouple to monitor the temperature of said cable, said at least one thermometer/thermocouple coupled to said controller.

5. The cable as claimed in claim 1, wherein said cable is configured to be included within a cable bundle.

\* \* \* \* \*